United States Patent [19]

Demaray et al.

[11] Patent Number: 5,635,036
[45] Date of Patent: Jun. 3, 1997

[54] COLLIMATED DEPOSITION APPARATUS AND METHOD

[75] Inventors: R. Ernest Demaray, Oakland; Vance E. Hoffman, Los Altos; John C. Helmer, Menlo Park; Young H. Park, San Ramon; Ronald R. Cochran, Mountain View, all of Calif.

[73] Assignee: Varian Associates, Inc., Palo Alto, Calif.

[21] Appl. No.: 134,351

[22] Filed: Oct. 8, 1993

Related U.S. Application Data

[63] Continuation of Ser. No. 780,882, Oct. 23, 1991, Pat. No. 5,330,628, and a continuation-in-part of Ser. No. 919,074, Jul. 23, 1992, Pat. No. 5,252,194, which is a continuation of Ser. No. 471,251, Jan. 26, 1990, abandoned, said Ser. No. 780,882, Oct. 23, 1991, is a continuation of Ser. No. 471,212, Jan. 29, 1990, abandoned.

[51] Int. Cl.⁶ .................................................. C23C 14/34
[52] U.S. Cl. ................... 204/192.12; 204/298.11; 204/298.19; 204/298.2
[58] Field of Search ............ 204/192.12, 192.3, 204/192.15, 298.06, 298.11, 298.14, 298.19, 298.09, 298.2

[56] References Cited

U.S. PATENT DOCUMENTS

| | | | |
|---|---|---|---|
| 4,717,462 | 1/1988 | Homma et al. | 204/192.15 X |
| 4,724,060 | 2/1988 | Sakata et al. | 204/298 |
| 4,824,544 | 4/1989 | Mikalesen et al. | 204/298 |
| 4,988,424 | 1/1991 | Woodward et al. | 204/298.11 X |

FOREIGN PATENT DOCUMENTS

| | | | |
|---|---|---|---|
| 58-67016 | 4/1983 | Japan . | |
| 0017173 | 1/1987 | Japan | 204/298.11 |
| 63-310965 | 12/1988 | Japan . | |

*Primary Examiner*—Nam Nguyen

[57] ABSTRACT

Sputtering apparatus and method which are particularly suitable for forming step coatings. A workpiece is supported in a chamber, particles are emitted from a sputter source in a substantially uniform manner throughout an area of greater lateral extent than the workpiece, the pressure within the chamber is maintained at a level which is sufficiently low to prevent substantial scattering of the particles between the source and the workpiece, and the particles are passed through a collimating filter having a plurality of transmissive cells with a length to diameter ratio on the order of 1:1 to 3:1 positioned between the source and the workpiece to limit the angles at which the particles can impinge upon the workpiece.

19 Claims, 12 Drawing Sheets

COLLIMATED DEPOSITION APPARATUS AND METHOD

This application is a continuation application of application Ser. No. 07/780,882, filed Oct. 23, 1991 now U.S. Pat. No. 5,330,628, which is a continuation of abandoned application Ser. No. 07/471,212 filed Jan. 29, 1990, abandoned. This case is also a continuation-in-part of U.S. application Ser. No. 07/919,074, filed Jul. 23, 1992, now U.S. Pat. No. 5,252,194, issued Oct. 12, 1993, which was a continuation of U.S. application Ser. No. 07/471,251, filed Jan. 26, 1990, now abandoned.

FIELD OF THE INVENTION

This invention pertains generally to sputter coating and, more particularly, to apparatus and a method for depositing a step coating on a workpiece by sputtering.

BACKGROUND OF THE INVENTION

Sputter coating is commonly employed in the formation of films on substrates in the manufacture of semiconductor devices, and planar magnetrons have long been used as sputtering devices to coat silicon wafers with various materials, such as aluminum, during the manufacture of integrated circuits.

With sputter coating, it is difficult to form a uniform thin film, or step coating, which conforms to the shape of a workpiece where a step occurs, e.g. at the upper or lower corner of an opening such as a hole or a via in the surface of a workpiece. It is also difficult to fill small openings (e.g. one micron, or less, in diameter or width) and to provide controlled film growth on the side and bottom walls of such openings. These difficulties arise because particles tend to leave the source in all directions, then collide with each other and scatter, arriving at the workpiece from a variety of angles. Particles which arrive at angles greater than about 45 degrees from normal to the workpiece surface tend to produce lateral growth on the surface, rather than impinging upon the walls of the openings. This lateral growth can result in overgrowth at the tops of the openings which can eventually close off the openings and prevent the particles from entering the openings.

OBJECTS AND SUMMARY OF THE INVENTION

It is in general an object of the invention to provide a new and improved sputtering apparatus and method for coating a workpiece.

Another object of the invention is to provide apparatus and a method of the above character which overcome the limitations and disadvantages of sputtering systems heretofore provided.

Another object of the invention is to provide apparatus and a method of the above character which are particularly suitable for use in forming step coatings.

These and other objects are achieved in accordance with the invention by supporting a workpiece in a chamber, emitting particles from a sputter source substantially uniformly throughout an area of greater lateral extent than the workpiece, maintaining the pressure within the chamber at a level which is sufficiently low to prevent substantial scattering of the particles between the source and the workpiece, and passing the particles through a particle collimating filter having a plurality of transmissive cells with a length to diameter ratio on the order of 1:1 to 3:1 positioned between the source and the workpiece to limit the angles at which the particles can impinge upon the workpiece.

DETAILED DESCRIPTION

Figure 1:
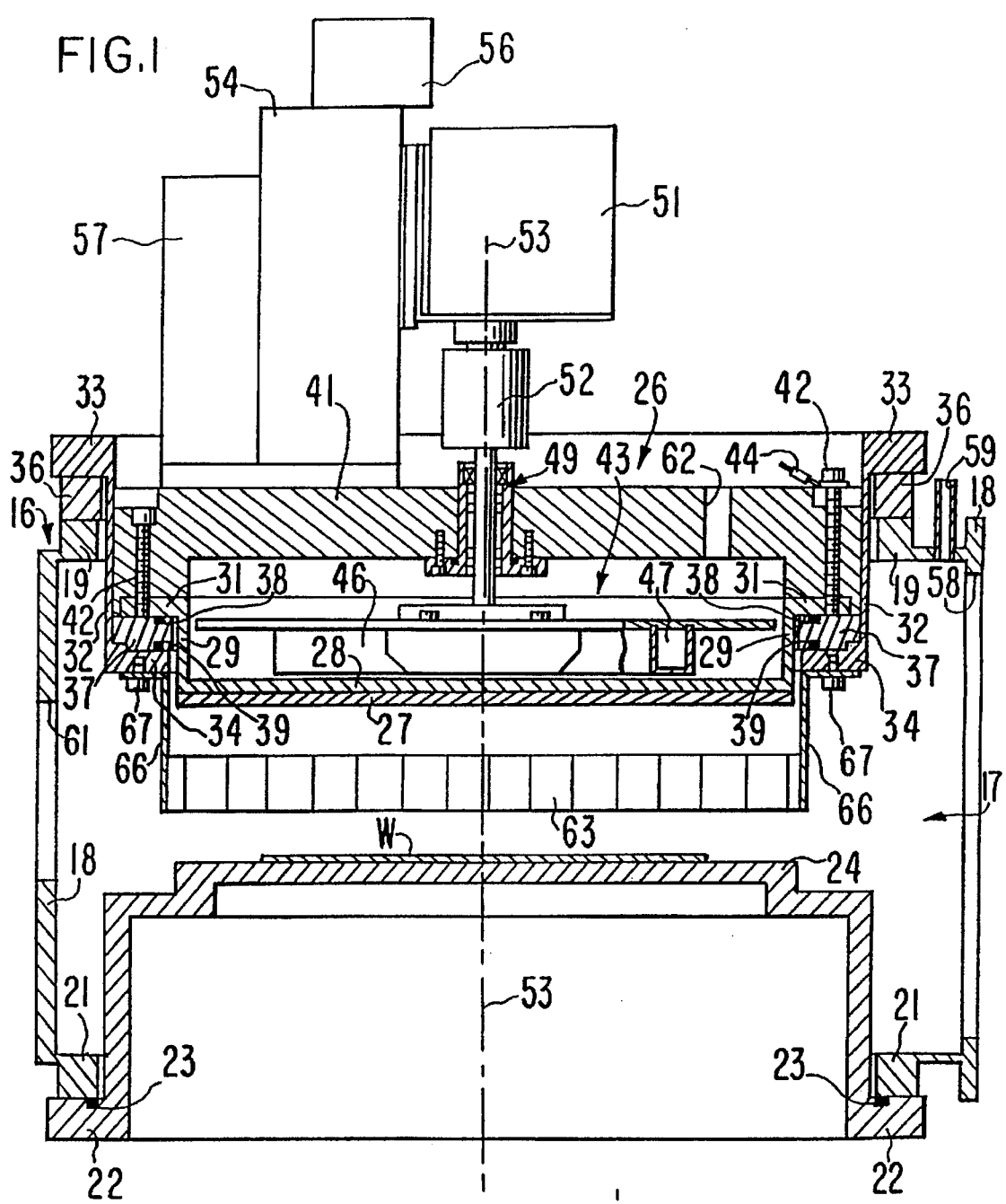
FIG. 1 is a diagrammatic cross-sectional view of one embodiment of sputtering apparatus incorporating the invention.
Figure 2:
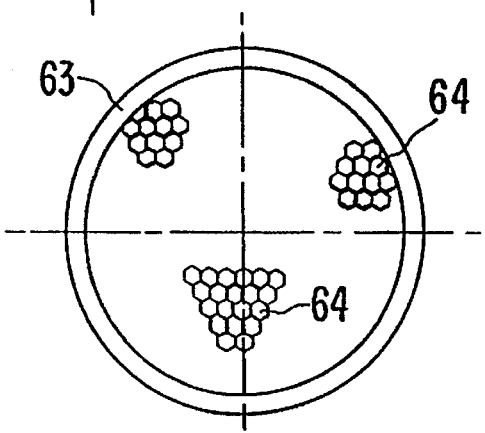
FIG. 2 is a top plan view, on a reduced scale, of a particle collimating filter for use in the embodiment of FIG. 1.

In the embodiment of FIG. 1, the sputtering apparatus has a housing 16 in which a sputtering chamber 17 is formed. The housing includes a cylindrical side wall 18 with annular flanges 19, 21 toward the upper and lower ends thereof, and a bottom wall 22 which mates with flange 21. An O-ring 23 provides a seal between the two walls.

The central portion of bottom wall 22 is raised to form a table 24 for supporting a wafer W or other workpiece to be coated. The workpiece is secured to the table by suitable means such as a peripheral clamping ring (not shown). The table includes conventional heating means (not shown) for controlling the temperature of the workpiece.

The housing and support table are fabricated of an electrically conductive material such as stainless steel and are connected electrically to ground.

A source 26 of particles for coating the workpiece is mounted in the upper portion of housing 16. In the embodiment illustrated, the source is a rotating magnetron source of the type described in detail in U.S. Pat. No. 5,252,194, issued Oct. 12, 1993, and entitled "Rotating Sputtering Apparatus for Selected Erosion". An important feature of this source is that is provides a substantially uniform emission of particles over an extended target area which is larger than the workpiece. This ensures that a uniform distribution of particles reaches the entire surface of the workpiece, including the peripheral areas. While this particular source is presently preferred, any other source which provides a similar particle distribution can be employed.

Source 26 includes a circular target 27 of aluminum or other material to be deposited. The target is disposed in parallel facing relationship to the workpiece and is of greater lateral extent than the workpiece. With a wafer having a diameter of 8 inches, for example, the target can have a diameter of 11.25 inches.

The target is mounted on the under side of an electrically conductive cathode plate 28 which has a cylindrical side wall 29 with an annular flange 31 at the upper end thereof. The cathode plate is supported by a cylindrical mounting bracket 32 with annular flanges 33, 34 at the upper and lower ends thereof. Flange 33 projects outwardly from side wall 29 and is positioned above the inwardly projecting housing flange 19. A spacer ring 36 is positioned between these flanges to permit adjustment of the spacing between the target and the workpiece, which is typically on the order of 1–3 inches.

Flange 31 on the cathode plate projects outwardly from side wall 29 and is positioned above the inwardly projecting flange 34 at the lower end of mounting bracket 32. A ring 37 of electrically insulative material is positioned between the flanges to insulate the cathode from the housing, and O-rings 38, 39 provide seals between the flanges and the insulator.

A cover 41 fabricated of an insulative material such as fiberglass is positioned within mounting bracket 32 and secured to flange 31 of the cathode plate by screws 42 to form a chamber 43 for the rotating magnet assembly of the magnetron. An electrical lead 44 is connected to one of the mounting screws 42 and to a suitable source (not shown) for applying a high negative potential to the cathode.

The magnet assembly includes a housing 46 in which an array of magnets 47 is mounted. The structure of these magnets and the manner in which they provide substantially uniform erosion over substantially the entire area of the target are disclosed in detail in the aforementioned U.S. Pat. No. 5,252,194, and that disclosure is incorporated herein by reference.

Magnet housing 46 is mounted on a shaft 48 which passes through a seal assembly 49 in cover 41 and is connected to a motor 51 by a coupling 52 for rotation about an axis 53. Motor 51 is mounted on a slider assembly 54 which is driven by a linear motor 56 for movement along axis 53, and the slider assembly is mounted on a bracket 57 affixed to housing 16. The slider assembly permits the spacing between the magnet array and the target to be adjusted to control the magnetic field beneath the target. As discussed more fully in the aforementioned, U.S. Pat. No. 5,252,194, with an 11.25 inch target, the rotating magnet array provides substantially uniform erosion throughout a circular region having a diameter of approximately 10 inches centered about the axis of rotation, which is sufficient for coating an 8 inch wafer.

Housing 16 includes a port 58 to which a vacuum pump (not shown) is connected for evacuating chamber 17, and a gas inlet 59 through which an inert gas such as Argon is introduced to support the magnetron discharge. As discussed more fully hereinafter, the pressure within the chamber is maintained at a pressure which is sufficiently low to prevent the sputtered particles from colliding with each other and scattering. Suitable pressures for this purpose are on the order of 0.1–1.5 milliTorr.

The housing also includes a port 61 through which wafers or other workpieces are transported into and out of chamber 17. This port is provided with a suitable closure such as a gate valve (not shown).

A port 62 is provided in cover 41 for introducing a coolant such as water into chamber 43 to cool the target and the magnet assembly.

A particle collimating filter 63 is positioned between the target and the workpiece to limit the angles at which the particles from the source can arrive at the surface of the workpiece. This filter, together with the extended source and the absence of scattering, is important in preventing lateral film growth and in forming a step coating with controlled growth on the bottom and side walls of an opening such as a hole or via.

The collimating filter has a plurality of cells 64 with apertures through which the particles pass in line-of-sight fashion. The cells are aligned with their axes parallel to axis 53 and perpendicular to the surfaces of target 27 and workpiece W. Each cell has an acceptance angle $\Theta_{ACC}$ which is defined as $$\Theta_{ACC} = \arctan(d/l),$$

where d is the diameter of the aperture and l is the length of the aperture, or the height of the cell. The acceptance angle is thus the maximum angle from the perpendicular at which particles can pass through the filter without striking the wall of a cell. The aspect ratio of the cells, i.e. the ratio of the cell height to the diameter, is referred to as the aspect ratio of the filter.

In the embodiment illustrated, the cells and their apertures are hexagonal in cross-section. This shape is preferred to a circular shape or a square shape because of the unusable areas between the walls of adjacent circular cells and the substantial difference in the distances between the opposing sides and the opposing corners of square cells. In this disclosure, the diameter utilized in defining the acceptance angle and the aspect ratio of the hexagonal cells is the mean diameter of the cells, although either the flat-to-flat diameter or the apex-to-apex diameter could be utilized for this purpose, if desired.

In the embodiment of FIG. 1, the collimating filter is positioned midway between the target and the workpiece and is attached to mounting bracket 32 by brackets 66 and screws 67.

The filter has an aspect ratio on the order of 1:1 to 3:1, with a mean cell diameter on the order of ⅜ inch for an 11.25 inch target and an 8 inch wafer separated by a distance on the order of 1–3 inches.

Figure 3A:
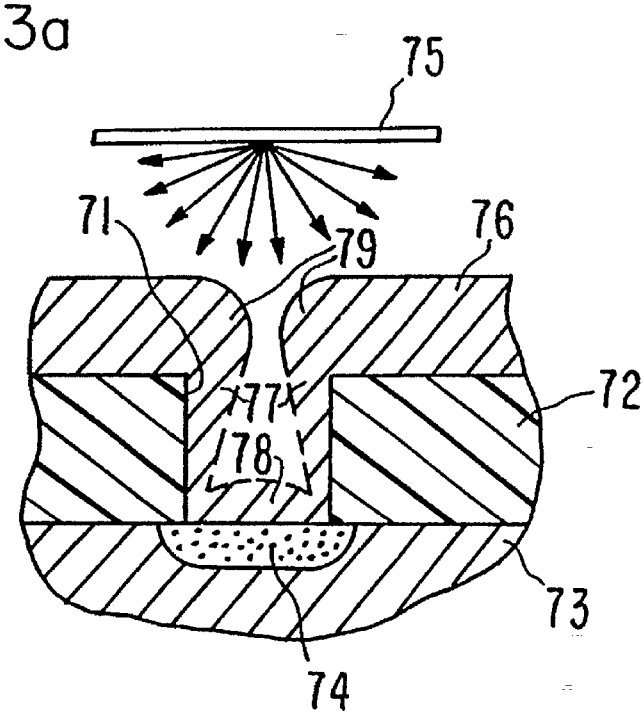
FIGS. 3a–3b are fragmentary cross-sectional views illustrating some of the problems encountered in the formation of a step coating with conventional sputtering techniques.

FIG. 3a illustrates some of the problems encountered in forming a step coating by sputtering prior to the invention. In this example, a hole 71 having a diameter on the order of one micron is formed in a one micron layer 72 of dielectric material on a silicon substrate 73, and a metallized contact is to be formed over a doped region 74 in the substrate at the bottom of the hole. The metallization particles are sputtered from a target 75 above the wafer. Each point on the target emits particles with a cosine distribution, and after collision and scattering, the particles arrive at the target at angles ($\Theta$) ranging from 0 to 90 degrees to the normal.

Particles arriving at angles greater than 45 degrees cannot impinge upon the bottom wall of the hole and tend to promote lateral growth on the surface of the wafer. As a result, a relatively thick film 76 is built up on the surface of the wafer, with relatively thin, nonuniform coatings 77, 78 on the side and bottom walls of the hole. In addition, the lateral growth of the surface film produces an overgrowth 79 at the top of the hole, which can close off the hole completely and prevent particles from entering it. The coating on the side walls and the bottom wall is subject to voiding, as illustrated by broken lines in the drawing, and there can even be areas where no coating is formed.

Figure 3B:
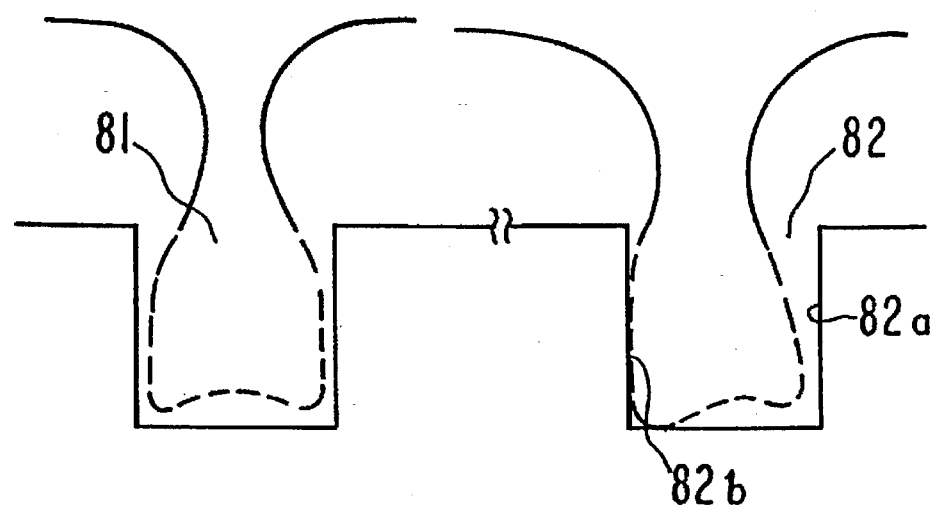

FIG. 3b illustrates a problem of asymmetrical coating which occurs in openings near the edge of a wafer with conventional sputtering techniques utilizing a 11.25 inch planar source, a surface deposition rate of 1 micron per minute, a target to wafer spacing of 7 cm, a sputtering pressure on the order of 3–7 milliTorr, and a wafer table temperature of 250 deg. C. In this figure, two holes 81, 82 are shown. Hole 81 is near the center of the wafer, and hole 82 is near the edge. Near the center of the wafer, the particle distribution is relatively uniform, and a relatively symmetrical coating is formed in hole 81. Toward the edge of the wafer, however, the distribution of particles is not as uniform, and the inwardly facing side wall 82a of hole 82 receives more particles than the outwardly facing wall 82b. This results in an asymmetrical coating of the side walls as well as the bottom wall.

With the collimation filter, the extended source, proper selection of pressure, and proper selection of the aspect ratio of the filter, it is possible to form good step coatings in which the growth of film on the side and bottom walls of an opening is controlled, and with proper temperature control, it is even possible to achieve planarization of the metallized coating over the opening.

FIGS. 4a–4d illustrate the effect of pressure on the angular distribution of particles arriving at the surface of the workpiece for filters of different aspect ratios. In the figures, the angle of arrival ($\Theta$) is plotted along the x-axis and the number of particles arriving at the surface is plotted along the y-axis. The data for these figures was obtained by computer simulation assuming uniform erosion from an 11 inch planar source, with a 150 mm substrate and a 9 cm source to substrate spacing in the Argon sputtering of aluminum. In each figure, curves representing the distributions for operating pressures of 0.0005 milliTorr, 0.02 milliTorr, 0.5 milliTorr and 1 milliTorr are shown, and in FIGS. 4b–4d a curve for a pressure of 2 milliTorr is also shown.

Figure 4A:
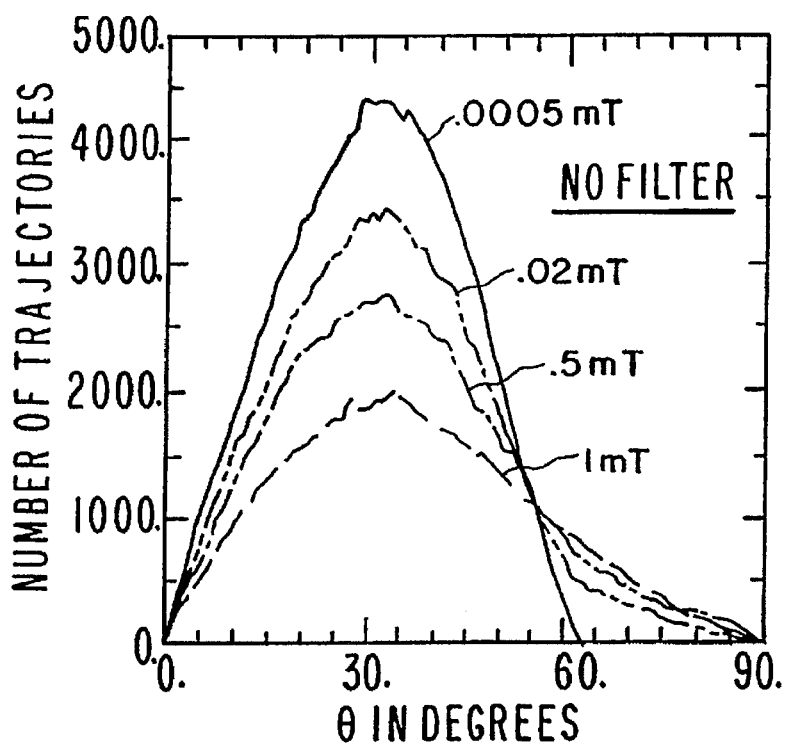
FIGS. 4a–4d are graphical representations showing the relationship between pressure and the angular distribution of particles arriving at the surface of a workpiece with collimating filters of different aspect ratios.
Figure 4B:
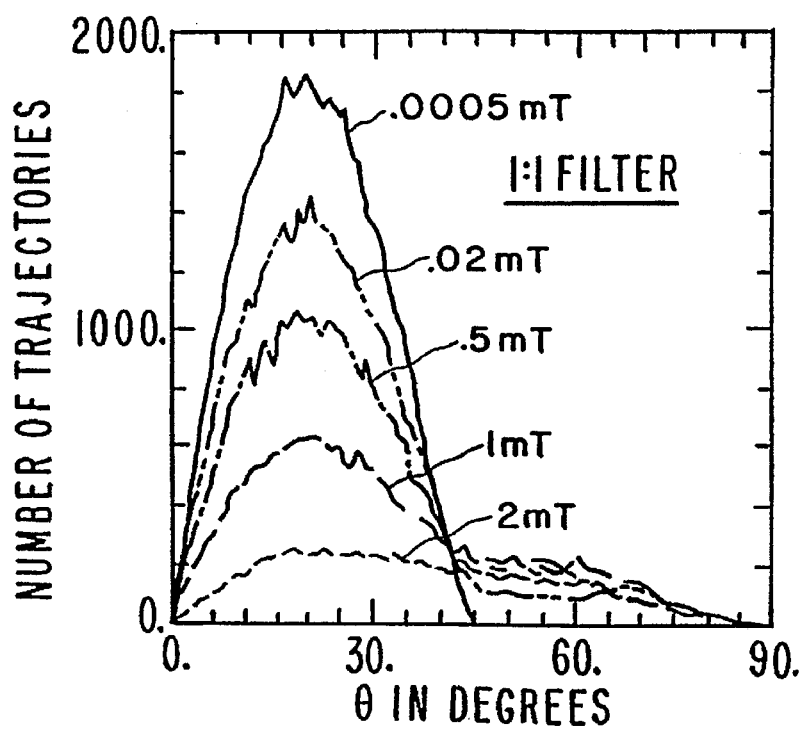
Figure 4C:
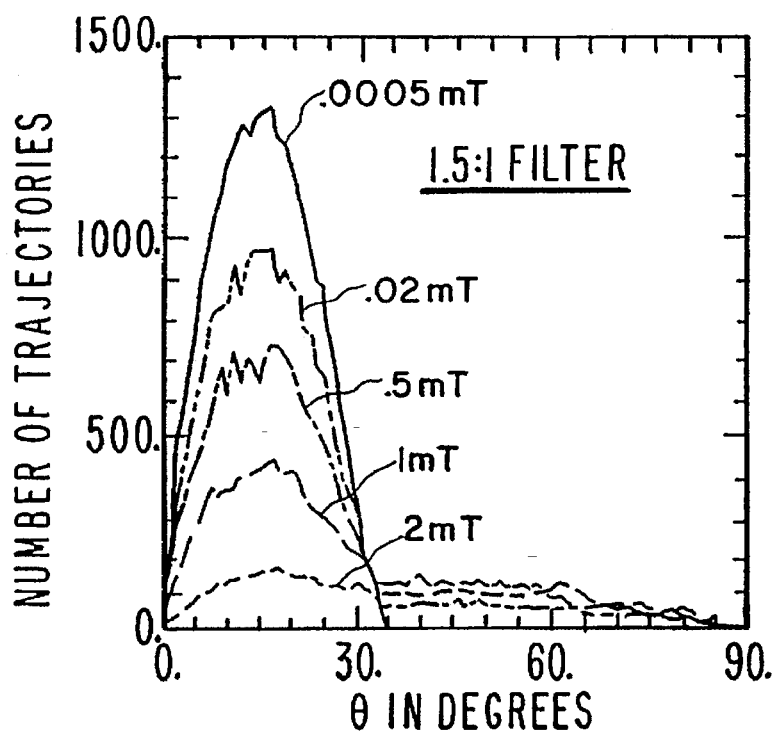
Figure 4D:
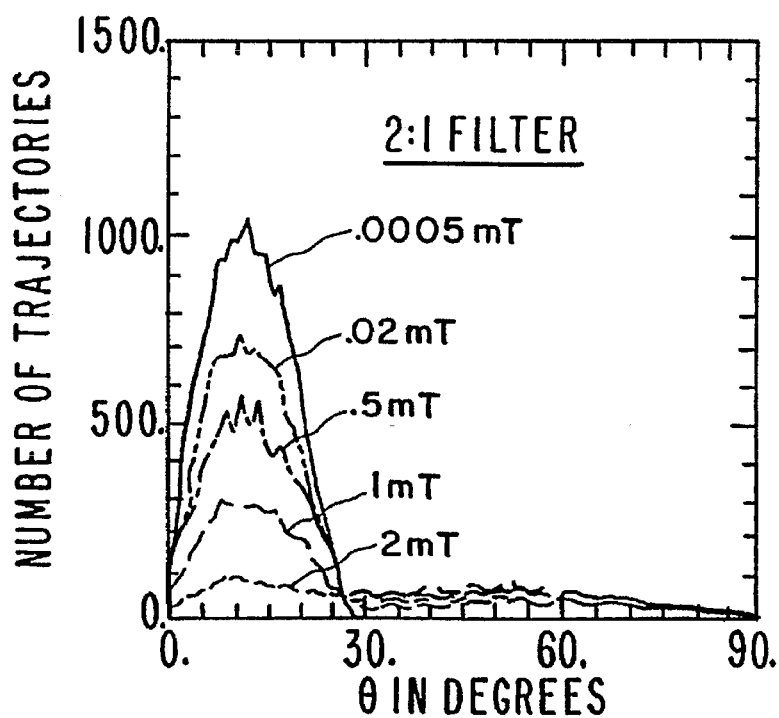

FIG. 4a shows the distribution with no filter, and FIGS. 4b–4d show the distributions with filters having aspect ratios of 1:1, 1.5:1 and 2:1, respectively.

Without the filter, the distribution is fairly symmetrical at the lower pressures for angles up to about 60 degrees. At the higher pressures, the distribution is less symmetrical, and greater relative numbers of the particles arrive at angles greater than 60 degrees.

With each of the filters, the distribution is fairly symmetrical at the lower pressures up to the acceptance angle of the filter. At the higher pressures, the distribution is less symmetrical, and greater relative numbers of the particles arrive at angles greater than the acceptance angle. The increase in the number of particles outside the acceptance angle at the higher pressures is due to scattering of the particles at the higher pressures, and these curves illustrate the importance of lower pressures to avoid scattering and keep as many particles as possible within the acceptance angle of the filter.

Figure 5:
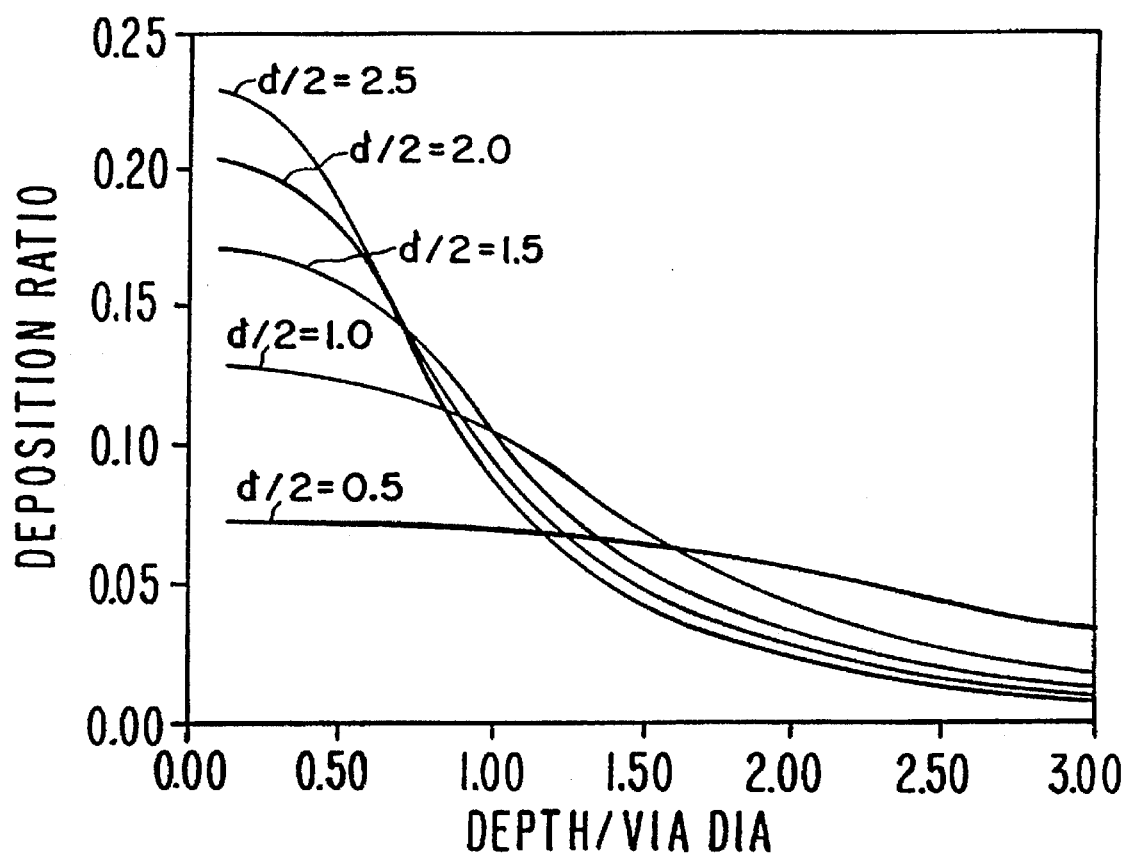
FIG. 5 is a graphical representation showing the relationship between side wall deposition rate and aspect ratios of holes or vias and collimating filters.

FIG. 5 illustrates the relationship between rate of deposition on the side wall and the aspect ratios of holes or vias and collimating filters. The aspect ratios of the openings (i.e. depth/diameter) are plotted along the x-axis, and the initial rate of the side wall deposition normalized to the deposition on the surface of the wafer is plotted along the y-axis. This normalized value is of interest in that it gives the fractional unit of thickness on the side wall for a unit of thickness on the surface. In this figure, the target is assumed to be sufficiently large that the location of the opening on the wafer is unimportant. Curves are shown for filters having aspect ratios ranging from 0.5:1 to 2.5:1.

From FIG. 5, it can be seen that filters having aspect ratios of 0.5:1 and 1:1 give fairly uniform side wall coatings for openings having aspect ratios up to about 1:1, with the 1:1 filter giving a substantially thicker coating than the 0.5:1 filter. With filters having higher aspect ratios, the wall coating thickness drops rapidly as the aspect ratio of the hole increases up to about 1:1. Thereafter, the thickness continues to decrease rapidly as the aspect ratio increases, approaching zero at a ratio of 3:1.

Figure 6A:
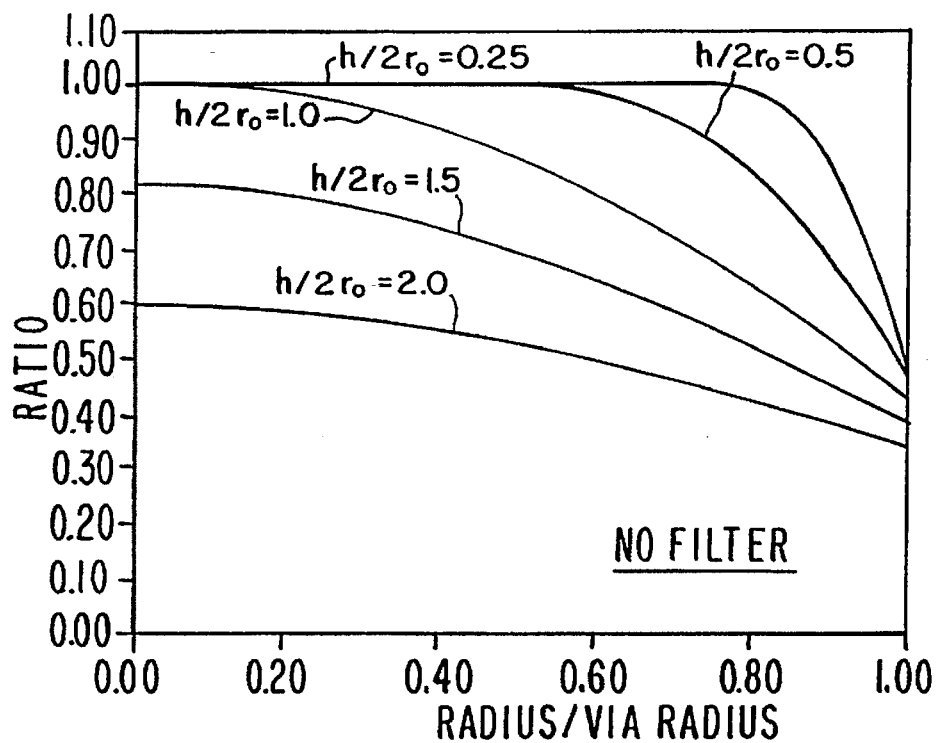
FIGS. 6a–6d are graphical representations showing the relationship between bottom wall deposition rate and aspect ratios of holes or vias and collimating filters.
Figure 6B:
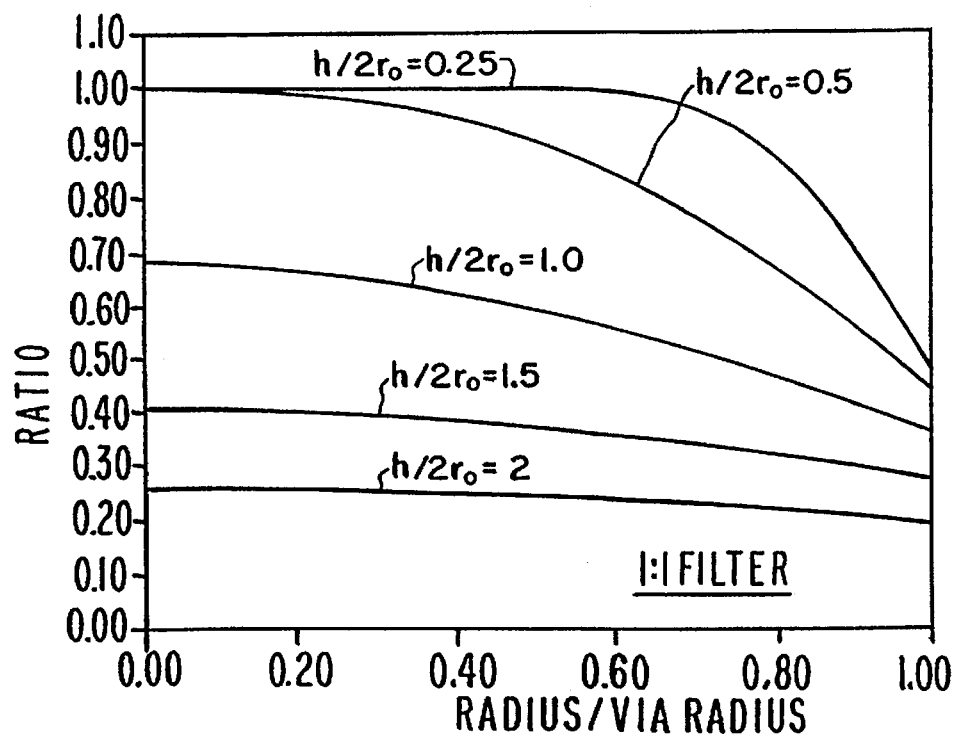
Figure 6C:
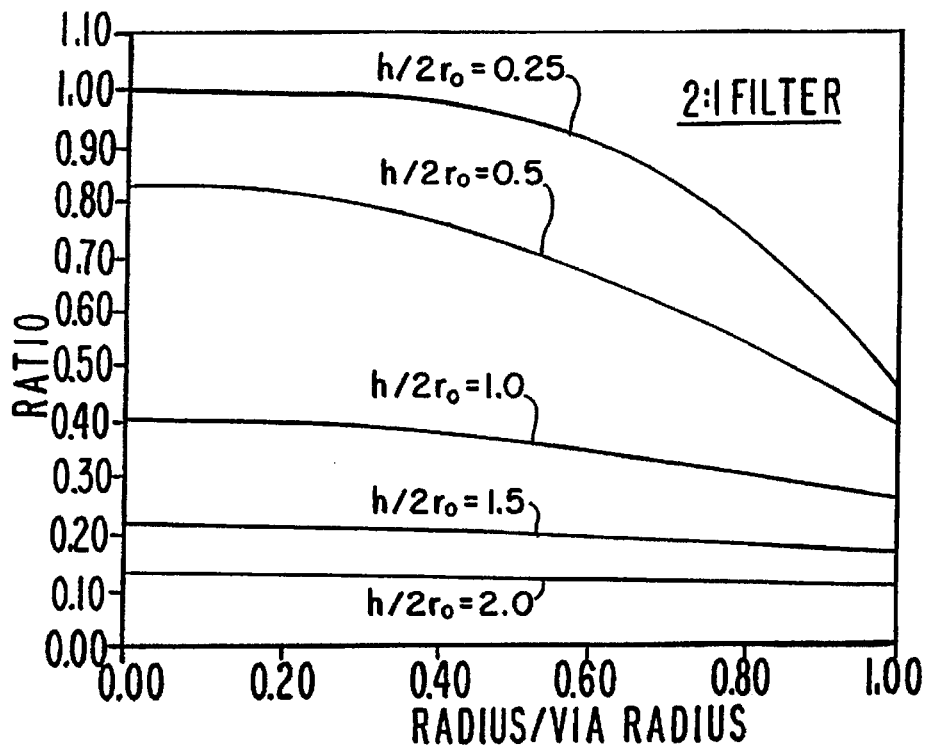
Figure 6D:
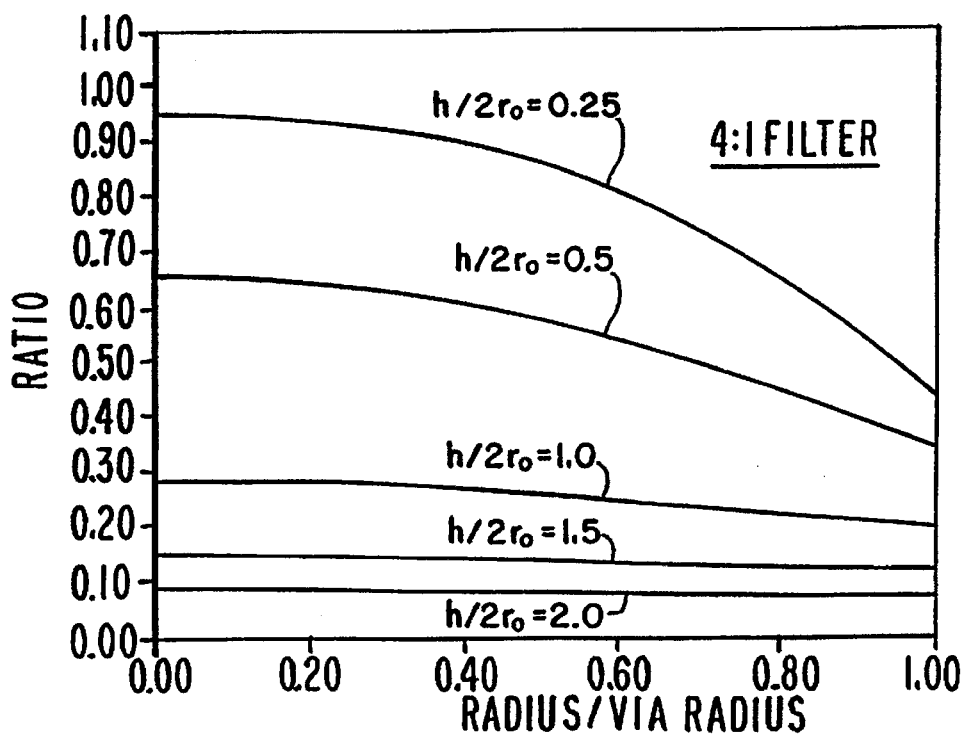

FIGS. 6a–6d illustrate the relationship between the initial deposition rate on the bottom wall and the aspect ratios of holes or vias and collimating filters. In these figures, distance from the center of the hole or via expressed as a fraction of the radius of the hole or via is plotted along the x-axis, and the rate of deposition on the bottom wall normalized to the rate of deposition on the surface of the wafer is plotted along the y-axis. As in the previous figure, the target is assumed to be sufficiently large that the location of the opening on the wafer is unimportant. Curves are included for holes having aspect ratios ranging from 0.25:1 to 2:1. FIG. 6a shows the relationship without a collimating filter, and FIGS. 6b–6d show the relationship for filters having aspect ratios of 1:1, 2:1 and 4:1, respectively.

With no filter and a hole having an aspect ratio of 1:1, the coating is full thickness toward the center of the opening but only about half thickness near the wall. With a filter having an aspect ratio of 1:1, the coating on the bottom wall is substantially more uniform, ranging from a normalized value of about 0.70 toward the center to about 0.40 near the wall. The bottom coating is even flatter with filters having aspect ratios of 2:1 and 4:1, but it is also substantially thinner.

With no filter and a hole having an aspect ratio of 2:1, the bottom coating varies in thickness from a normalized value of about 0.60 toward the center to about 0.30 near the wall. With a filter having an aspect ratio of 1:1, the coating is more uniform, ranging from a normalized thickness of about 0.26 near the center to about 0.20 toward the wall. With a 2:1 filter, the coating is even more uniform, with a normalized thickness of about 0.13 from the center to the wall.

Thus, FIGS. 6a–6d illustrate the desirability of utilizing a filter with the same aspect ratio as the opening in order to provide uniformity in the coating on the bottom wall of the opening.

Figure 7:
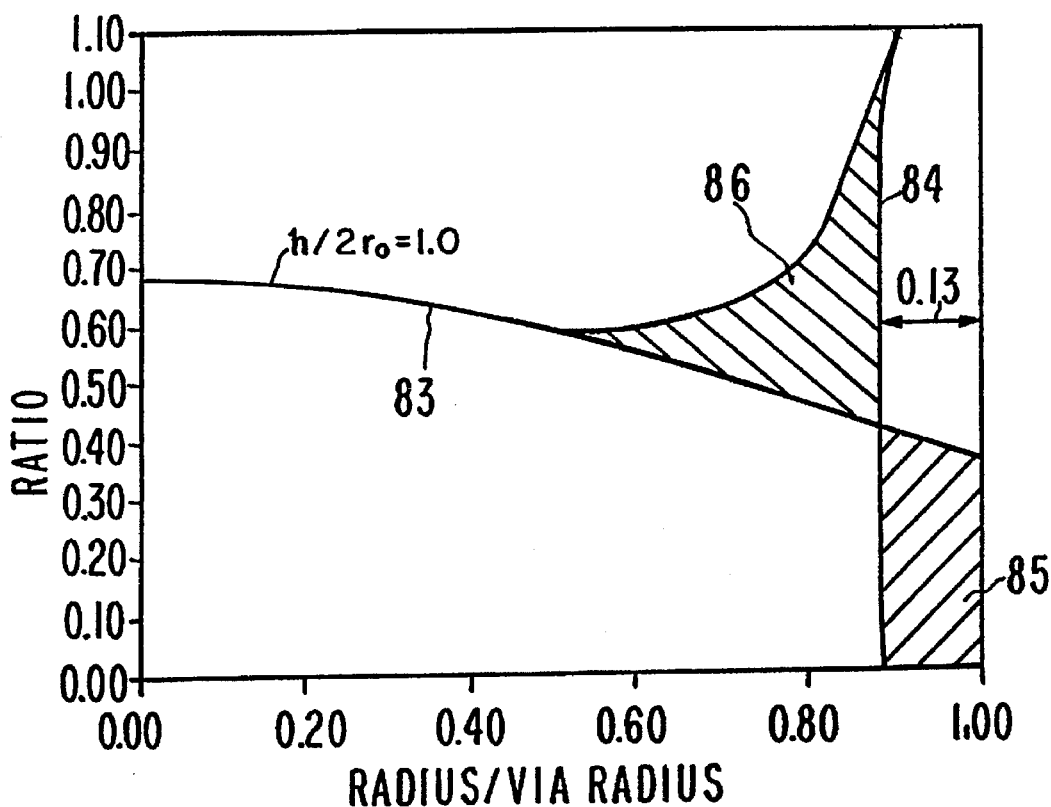
FIG. 7 is a graphical representation showing the combined bottom and side wall deposition rates in a hole or via utilizing a collimating filter in accordance with the invention.

FIG. 7 illustrates the combined effects the invention on side wall coating and bottom wall coating for an opening and a collimating filter each having an aspect ratio of 1:1. This figure is similar to FIGS. 6a–6d in that the distance from the center of the hole is plotted along the x-axis, and the thickness of the bottom wall deposition normalized to the deposition on the surface of the wafer is plotted along the y-axis. A curve 83 taken from FIG. 6b shows the bottom wall thickness for a hole and a filter having an aspect ratio of 1:1, and a curve 81 taken from FIG. 5 shows the coating on the side wall for a hole and a filter with this aspect ratio. In the area in the bottom corner of the opening designated by the reference numeral 85, there is an overlap of the coatings formed on the side wall and on the bottom wall, and the excess material from this area builds up in the area 86, forming a radius at the corner of the coating.

Figure 8:
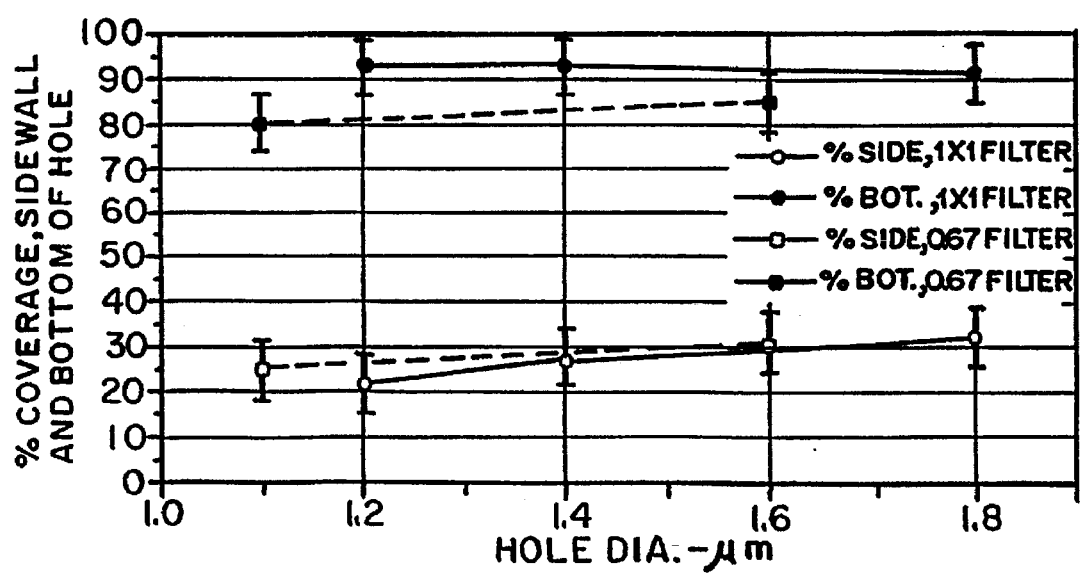
FIG. 8 is a graphical representation showing relative side and bottom wall coverages obtained with collimating filters of different aspect ratios.

FIG. 8 illustrates the relative side and bottom wall coverages obtained in holes ranging from about 1 to 2 microns in diameter with collimating filters having aspect ratios of 1:1 and 0.67:1. In this figure, the hole size is plotted along the x-axis, and the ratio of the wall thickness to the surface film thickness is plotted along the y-axis. The data shown in this figure was obtained experimentally from the deposition of aluminum containing 1% silicon at a temperature of 100 deg. C. and a sputtering pressure of 1 milliTorr. This data confirms a bottom wall to side wall thickness ratio of about 6 to 1, which is in accord with simulations represented in the other figures.

Figure 9A:
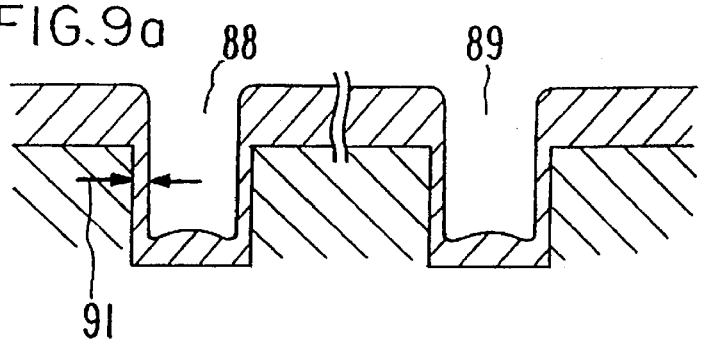
FIGS. 9a–9b are fragmentary cross-sectional views of a workpiece, illustrating the formation of a step coating with the apparatus and method the invention.
Figure 9B:
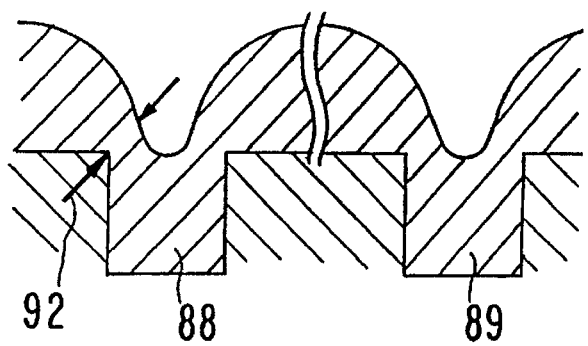

FIGS. 9a–9b illustrate the formation of a step coating when the apparatus and method of the invention are employed. Each of these figures shows a pair of holes 88, 89 having aspect ratios of 1:1, with hole 88 being located near the center of a wafer and hole 89 being toward the edge. Sputtering is performed at a pressure of 0.5 milliTorr and a wafer table temperature of 250 deg. C., with an 11.25 inch planar source, a 7 cm target to wafer spacing, a collimation filter having an aspect ratio of 1:1, and a surface deposition rate of 1 micron per minute.

FIG. 9a shows a half thickness coating of 0.5 micron on the wafer surface, and FIG. 9b shows a full thickness coating of 1 micron on the surface. The figures illustrate how the coating builds up evenly on the side walls of the openings without the overcoating and asymmetry of the prior art techniques illustrated in FIGS. 3a–3b. Another advantage of the invention which is apparent from these figures is that the thinnest part of the step coating is no longer at the lower corner of the hole as it is in the coatings of FIGS. 3a–3b. With the half thickness coating, the thinnest point occurs along the side wall, as indicated by the arrows 91, and with the full thickness coating, it occurs at the upper corner of the hole, as indicated by the arrows 92. From these figures, it can also be noted that the aspect ratio of the unfilled volume increases as the coating builds up in the holes.

Figure 10:
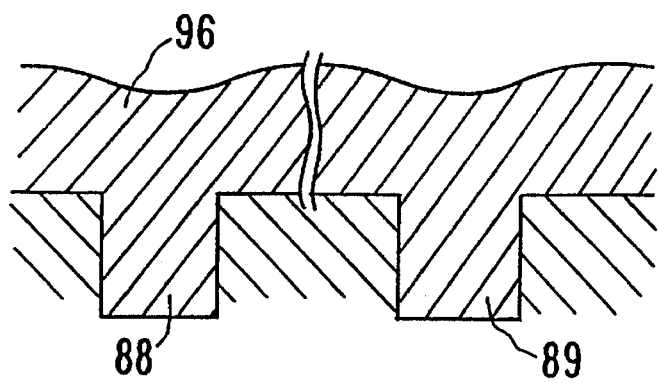
FIG. 10 is a view similar to FIGS. 9a–9b, illustrating the formation of another step coating with the apparatus and method the invention.
Figure 11:
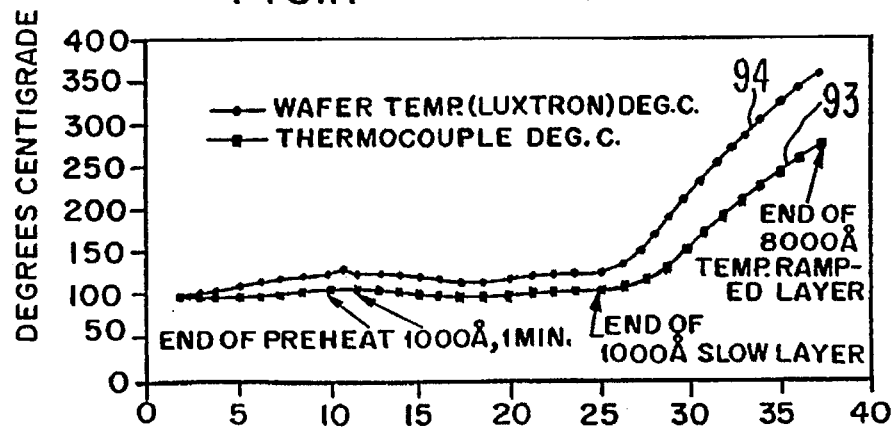
FIG. 11 is a graphical representation illustrating the temperature conditions and deposition rates utilized in obtaining the coating of FIG. 10.

FIG. 10 illustrates a coating which is produced utilizing the same operating parameters as in the examples of FIGS. 9a–9b, except that the temperature of the wafer is controlled in the manner illustrated in FIG. 11. In this example, the temperature of the wafer table is monitored with a thermocouple, and the temperature of the wafer is monitored with a non-contact sensor. In FIG. 11, temperature is plotted as a function of time, with curves 93, 94 showing the wafer table and wafer temperatures, respectively.

As illustrated in FIG. 11, the wafer is preheated initially to a temperature on the order of 100–125 deg. C. for a period of 10 minutes, following which the temperature is held constant and sputtering begins at a rate of 1000 Angstroms per minute for one minute. An additional 1000 Angstroms is deposited in a period of 15 minutes. Thereafter, the sputtering rate is increased, and 8000 Angstroms is deposited while the temperature is ramped up to a level of 260–360 deg. C. over a period of about 12 minutes. The resulting coating 96 fills the holes completely and exhibits good planarization above the holes at both the center and the edge of the wafer.

Figure 12:
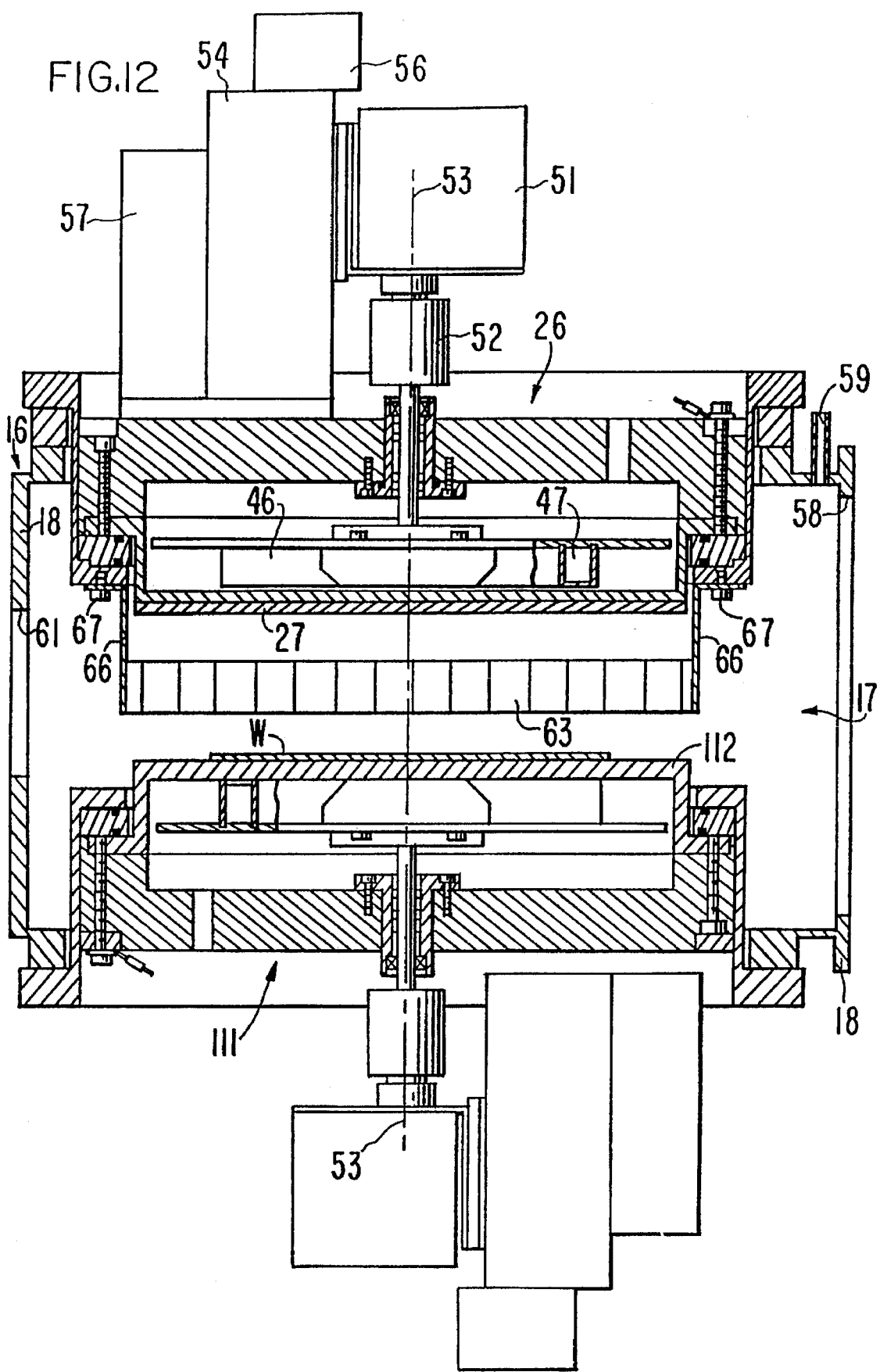
FIGS. 12–14 are diagrammatic cross-sectional views of additional embodiments of sputtering apparatus incorporating the invention.

FIG. 12 illustrates an embodiment of the invention which is suitable for either sputtering or etching or for simultaneous sputtering and etching of a substrate. This embodiment is similar to the embodiment of FIG. 1 except that the bottom wall and wafer support table are replaced with a second magnetron assembly 111 which is similar to source 26 but is mounted in an inverted position with the wafer or workpiece W mounted on its cathode plate 112 in place of a target. As in the embodiment of FIG. 1, housing 16 is grounded and a high negative DC voltage is applied to the cathodes. Particles are sputtered from the target on the upper magnetron and from the wafer on the lower magnetron. Thus, the surface of substrate W is simultaneously sputter coated by particles dislodged from the surface of target 27 by the operation of the upper magnetron and sputter etched by the particles dislodged from the surface of the substrate by the operation of the lower magnetron.

A particle collimating filter 63 is mounted on the upper magnetron and is positioned midway between the target and the workpiece to control the angles at which the particles from the target impinge upon the workpiece as in the embodiment of FIG. 1.

Figure 13:
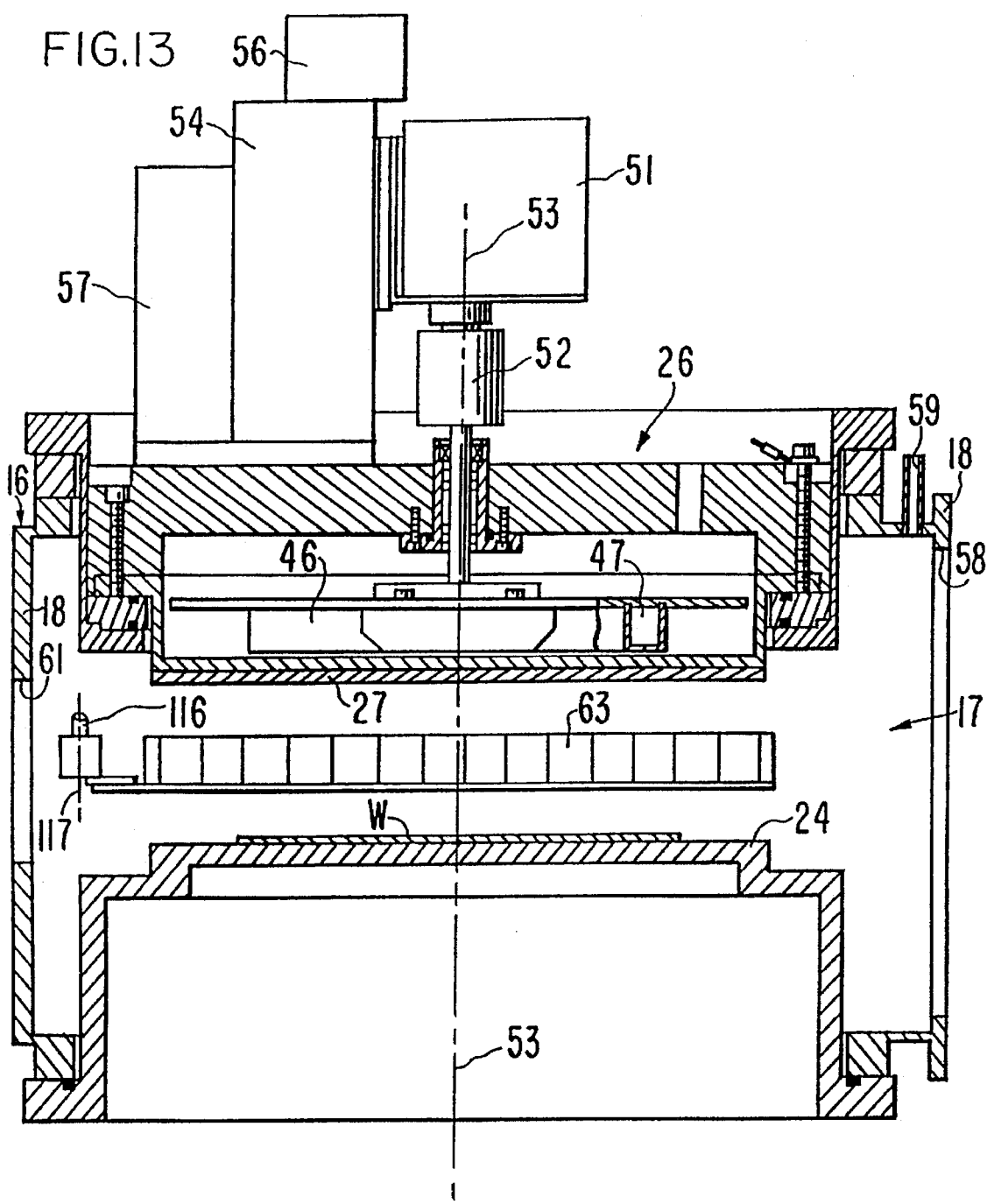

The embodiment of FIG. 13 is similar to the embodiment of FIG. 1 except that the collimating filter 63 is movable in a direction parallel to the surfaces of the target 27 and the workpiece W, rather than being mounted in a fixed position relative to the target and workpiece. The filter is mounted on a shaft 116 which can be rotated back and forth a small amount about an axis 117 which is spaced from the axis 53 of the magnetron. With the filter mounted in a stationary position, there may be some shadowing or shading whereby the walls of the cells create areas on the workpiece which are blocked from line of sight transmission from the target, and these areas may receive less coating than the rest of the workpiece. By moving the filter a distance corresponding to about one half of the diameter of a cell, the shadowing or shading is eliminated. If desired, a translational motion or an axial motion can be utilized instead of a rotational motion to eliminate the fine structure produced by shadowing. With these alternative motions, a movement of about one half of the cell diameter is still sufficient to eliminate the fine structure. This represents a significant improvement over prior art techniques in which the wafer is moved, and movement on the order of the diameter of the wafer is necessary. The movement of the filter is particularly effective if the filter is positioned as close to the wafer surface as possible.

Figure 14:
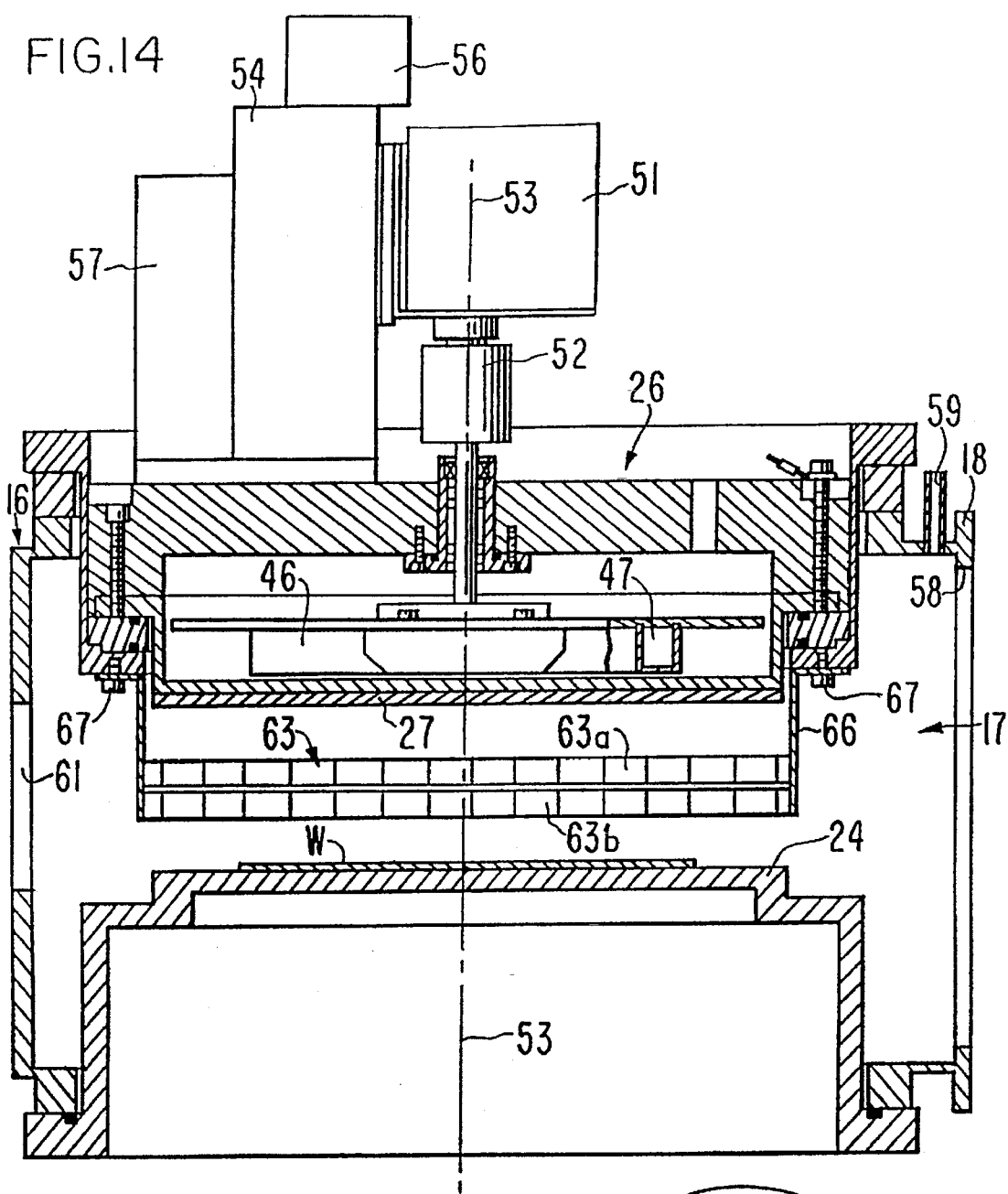

FIG. 14 illustrates an embodiment of the sputtering apparatus in which the aspect ratio of the collimating filter can be changed during a coating operation. As noted above, it is desirable to match the aspect ratio of the filter to that of the opening being coated, but the aspect ratio of the unfilled volume continually increases as the opening is filled. By increasing the aspect ratio of the filter, the desired match can be maintained.

In the embodiment of FIG. 14, filter 63 is formed in two sections 63a and 63b which are movable axially relative to each other, and the aspect ratio is changed by changing the spacing between the sections, which effectively changes the height of the cells. The two sections are brought together at the start of a coating operation, and as the deposition progresses and the aspect ratio of the opening changes, the sections are separated to keep the aspect ratios approximately equal.

Figure 15:
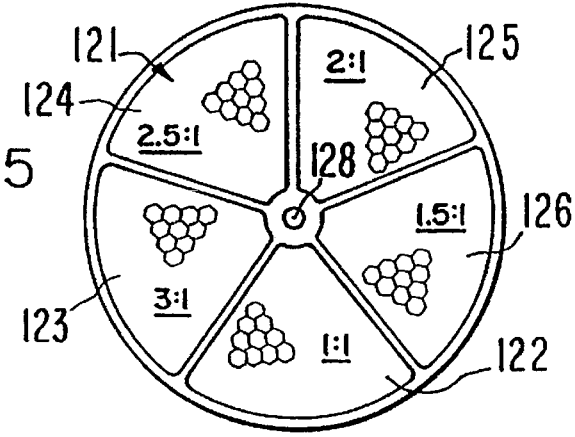
FIG. 15 is a diagrammatic top plan view of another embodiment of a collimating filter for use in sputtering apparatus incorporating the invention.

FIG. 15 illustrates another embodiment of a collimating filter which permits the aspect ratio of the filter to be changed as the deposition progresses. In this embodiment, the filter is in the form of a wheel 121 having a plurality of filter sections 122–126 of different aspect ratios. In the embodiment illustrated, the cells in sections 122–126 have aspect ratios of 1:1, 1.5:1, 2:1, 2.5:1 and 3:1, respectively. The wheel is adapted for rotation about an axis 128 spaced from the axis 53 of the magnetron to bring successive ones of the filter sections into position between the target and the workpiece.

Rather than changing the aspect ratio of the filter, the effect of the increasing aspect ratio of the unfilled volume can also offset by using a filter having a substantially greater aspect ratio than the hole, e.g. a filter having an aspect ratio of 1.5:1 or 2:1 for a hole having an aspect ratio of 1:1, starting the deposition at a pressure substantially higher than the preferred pressure for a feature having the aspect ratio of the hole, and reducing the pressure as the deposition progresses. With the 1:1 aspect ratio, for example, the pressure might start at a level of 1.5 milliTorr and be reduced to a level of 0.5–1.0 milliTorr as the deposition progresses.

It is apparent from the foregoing that a new and improved sputtering apparatus and method have been provided. While only certain presently preferred embodiments have been described in detail, as will be apparent to those familiar with the art, certain changes and modifications can be made without departing from the scope of the invention as defined by the following claims.

We claim:

1. A sputtering apparatus for depositing a coating on a workpiece, comprising:

a chamber;

means for supporting the workpiece in the chamber in a stationary position;

a magnetron sputter source having a central region generally opposing said workpiece and means for emitting particles substantially uniformly throughout an area of greater lateral extent than the workpiece, said area of uniform emission including the central region of the sputter source, so that at least some of said particles will be deposited on said workpiece, the individual deposited particles impinging on the surface of the workpiece at angles of incidence;

a particle collimating filter having a plurality of substantially identical transmissive cells with a length to diameter ratio defining an aspect ratio in the range of 1:1 to 3:1 positioned between the source and the workpiece for limiting the angles of incidence at which the particles can impinge upon the workpiece; and means for maintaining a pressure within the chamber at a level which is sufficiently low to prevent substantial scattering of the particles between the collimating filter and the workpiece.

2. The sputtering apparatus of claim 1 wherein the collimating filter is positioned substantially midway between the source and the workpiece.

3. The sputtering apparatus of claim 1 wherein each of the transmissive cells has an aperture of hexagonal cross section.

4. The sputtering apparatus of claim 1 wherein the length to diameter ratio of the collimating cells is substantially equal to the aspect ratio of an opening to be coated in the workpiece.

5. The sputtering apparatus of claim 1 wherein the collimating filter comprises means for adjusting the length to diameter ratio of the transmissive cells of the collimating filter to permit the length to diameter ratio of the cells to change.

6. The sputtering apparatus of claim 1 wherein the means for maintaining the pressure is adapted to maintain the pressure at a level on the order of 0.5–1.0 milliTorr.

7. The sputtering apparatus of claim 1 wherein the collimating filter is spaced from the workpiece by a distance which is at least one-half of the diameter of one of the transmissive cells.

8. The sputtering apparatus of claim 1 wherein said collimation filter is mounted in a stationary position.

9. A method of depositing a coating on a workpiece, comprising the steps of:

supporting the workpiece in a stationary position in a chamber;

emitting particles from a magnetron sputter source substantially uniformly throughout an area of greater lateral extent than the workpiece, including an area within the central region of said sputter source generally opposing said workpiece so that at least some of said particles will be deposited on said workpiece, the individual deposited particles impinging on the surface of the workpiece at angles of incidence;

passing the particles through a collimating filter having a plurality of substantially identical transmissive cells with a length to diameter ratio defining an aspect ratio in the range of 1:1 to 3:1 positioned between the source and the workpiece to limit the angles of incidence at which the particles can impinge upon the workpiece; and maintaining pressure within the chamber at a level which is sufficiently low to prevent substantial scattering of the particles between the collimating filter and the workpiece.

10. The method of claim 9 wherein the collimating filter is positioned substantially midway between the source and the workpiece.

11. The method of claim 9 wherein said workpiece has at least one opening to be coated, said at least one opening having an average vertical length and an average diameter defining an aspect ratio and wherein the length to diameter ratio of the transmissive cells of the collimating filter is substantially equal to the aspect ratio of said at least one opening to be coated in the workpiece.

12. The method of claim 9 wherein the pressure within the chamber is maintained at a level on the order of 0.5–1.0 milliTorr.

13. The method of claim 9 wherein the collimating filter is held stationary during sputtering.

14. Sputtering apparatus for depositing a step coating in an opening in a workpiece, said opening having an aspect ratio comprising:

a chamber;

means for supporting the workpiece in the chamber;

a sputter source for emitting particles for forming the coating on the workpiece, so that at least some of said particles will be deposited on said workpiece, the individual deposited particles impinging on the surface of the workpiece at angles of incidence;

a particle collimating filter having a plurality of transmissive cells positioned between the source and the workpiece for limiting the angles of incidence at which the particles can impinge upon the workpiece; and means for adjusting the filter so that the cells have a length to diameter ratio which may be varied.

15. The apparatus of claim 14 wherein the collimating filter has a plurality of groups of cells having different length to diameter ratios, and wherein the means for adjusting the filter includes means for positioning different ones of the groups of cells between the source and the workpiece.

16. A sputtering apparatus for depositing a thin film onto an opening in a substrate, said opening having a bottom wall and a side wall, comprising:

a vacuum chamber;

means for supporting said substrate in a stationary position within said vacuum chamber;

a magnetron sputter source having a surface generally opposing said substrate for emitting particles uniformly from an area of said surface which includes the center thereof and which is larger than the substrate;

a stationary particle collimating filter positioned between the sputter source and the substrate, said collimating filter comprising a plurality of substantially identical individual cells through which particles emitted from said sputter source must pass before reaching said substrate, said filter being spaced apart from said substrate by a distance which is sufficient to avoid shadowing of deposited film by said collimating filter, said cells having an aspect ratio defined by the length and width thereof, the aspect ratio of the cells being selected such that a substantial thickness of film is deposited on a sidewall of said opening.

17. The apparatus of claim 16 wherein the aspect ratio of the individual cells is in the range of 1:1 to 3:1.

18. The apparatus of claim 16 wherein the aspect ratio of the individual cells is selected to produce a film thickness on said side wall which is at least fifty percent of the thickness of the film which is deposited on the bottom wall.

19. The apparatus of claim 16 wherein said opening has an average depth and an average diameter defining an aspect ratio and the aspect ratio of the individual cells is selected to be substantially the same as the aspect ratio of the opening.

* * * * *